(12) United States Patent
Yachareni et al.

(10) Patent No.: US 6,212,098 B1
(45) Date of Patent: Apr. 3, 2001

(54) VOLTAGE PROTECTION OF WRITE PROTECT CAMS

(75) Inventors: Santosh K. Yachareni; Edward V. Bautista, Jr., both of Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/602,095

(22) Filed: Jun. 22, 2000

Related U.S. Application Data
(60) Provisional application No. 60/182,383, filed on Feb. 14, 2000.

(51) Int. Cl.[7] .................................................. G11C 16/04
(52) U.S. Cl. .............................. 365/185.04; 365/185.18; 365/195
(58) Field of Search ................................... 365/195, 196, 365/185.18, 185.04, 185.22, 49

(56) References Cited

U.S. PATENT DOCUMENTS

| | | | |
|---|---|---|---|
| 5,388,248 | * | 2/1995 | Robinson et al. ................. 365/52 |
| 5,546,402 | * | 8/1996 | Niijima et al. .................... 714/710 |
| 5,673,222 | * | 9/1997 | Fukumoto et al. ............. 365/185.04 |
| 5,742,935 | * | 4/1998 | Hazen et al. ..................... 711/152 |
| 6,000,004 | * | 12/1999 | Fukumoto ......................... 711/103 |
| 6,125,055 | * | 9/2000 | Kasa et al. ..................... 365/185.04 |

* cited by examiner

*Primary Examiner*—Son Mai
(74) *Attorney, Agent, or Firm*—Brinks Hofer Gilson & Lione

(57) ABSTRACT

The present invention discloses systems and methods for providing voltages during programming to the control gates of write protect CAMS. Upon entering a write protect CAM programming mode, at least one voltage supply circuit is activated to supply the predetermined voltage for the control gates of the write protect CAMS. When the write protect CAMS are programmed, a gate control circuit transfers a programming voltage to the control gates of the write protect CAMS. Following programming and verification of the write protect CAMS, the gate control circuit holds the control gates of the write protect CAMS at a ground voltage level.

22 Claims, 3 Drawing Sheets

VOLTAGE PROTECTION OF WRITE PROTECT CAMS

RELATED APPLICATION

This application claims the benefit under 35 U.S.C. §119 (e) of Provisional U.S. patent application Ser. No. 60/182,383 filed on Feb. 14, 2000, entitled VOLTAGE PROTECTION OF WRITE PROTECT CAMS, which is herein incorporated by reference.

FIELD OF THE INVENTION

The present invention relates generally to non-volatile memory devices and, more particularly, to a method and system for programming a plurality of write protect CAMS in a flash electrically erasable programmable read only memory (EEPROM).

BACKGROUND OF THE INVENTION

Flash memories are popular memory storage devices because they store information in the absence of continuous power and are capable of being constructed in very compact form. Flash memory is typically constructed by fabricating a plurality of floating-gate transistors in a silicon substrate. A floating-gate transistor is capable of storing electrical charge on a separate gate electrode known as a floating gate that is separated by a thin dielectric layer from a control-gate electrode. Generally speaking, information is stored in a non-volatile memory device by the storage of an electrical charge in the floating gate.

Flash memory are in the form of a memory array that includes rows and columns of flash transistors, with each transistor being referred to as a memory cell that includes a control gate, a drain and a source. The memory cells within the memory array are programmed, erased and read by applying a predetermined voltage to the respective control gate, drain and source of the memory cells within a sector. As known in the art, the memory array is sub-divided into sectors containing rows and columns of memory cells.

Flash memory may be used to store various types of information that can generally be divided into two categories, code and data. Code corresponds to program code that is used to execute various operations in the flash memory. Data generally corresponds to fields of data that changes more frequently than code. Because code rarely, if ever, changes in the lifetime of some devices, it is desirable to have the ability to write protect the sectors that store code, while leaving some sectors unprotected. Providing a write protect function allows manufacturers to ensure that data does not mistakenly get written into a sector that is designated for code.

The write protect function is provided by the use of a type of data storage device known in the art as a content addressable memory cell or CAM cell. The CAM cell is a form of transistor that includes a control gate, a drain and a source that are typically electrically connected with a gate line, a bitline and a source line respectively. A write protect CAM is programmed by a user to designate that a particular sector in the flash memory is already programmed with code and that no data should be written to that sector.

To program the write protect CAM associated with previously programmed sectors, the user enters a programming mode that applies predetermined voltages to the bitline, the gate line and the source line of the particular CAM cell associated with that sector. During the programming of the write protect CAM, the voltage on the control gates (gate line) of the write protect CAMS is raised to a predetermined voltage level. When programming is complete, the predetermined voltage is no longer applied but some magnitude of voltage may still be applied to the control gates of the prior art write protect CAMS.

As known in the art, the duration and/or magnitude of voltage applied to the control gate of the CAM cell following programming may stress the CAM cell and disturb the data programmed into the CAM cell. If the data in the write protect CAMS is disturbed, single bit charge loss may occur and the programmed designation of write protection of the sectors in the flash memory can become unreliable. As a result, a sector containing code data that is not to be overwritten, may improperly become designated as not write protected, thereby allowing the user to overwrite the code data.

To that end, a need exists for a flash memory that is capable of programming writ protect CAMS to designate predetermined sectors as write protected that will only apply programming voltages to the control gate of the write protect CAMS during the programming mode.

SUMMARY OF THE PRESENT INVENTION

The present invention discloses a method of controlling the voltage applied to a plurality of write protect CAMS in a memory device, which is a flash memory in the preferred embodiment. In the preferred embodiment, a predetermined voltage is generated with at least one voltage supply circuit. Then, the predetermined voltage is transferred with a gate control circuit to at least one control gate of a write protect CAM. When the predetermined voltage is not being transferred to the control gate of the write protect CAMS, the gate control circuit connects the control gate of the write protect CAMS to a ground voltage level.

The predetermined voltage that is supplied by the voltage supply circuits is either a programming voltage or a program verify voltage. The programming voltage is used program the write protect CAMS and the program verify voltage is used to verify that the write protect CAMS have been properly programmed. In the preferred embodiment, the programming voltage is about 8.5 V and the program verify voltage is about 2 V. The gate control circuit comprises a margin voltage logic circuit, a high voltage logic circuit, a grounding gate logic circuit and a reverse bias circuit. During operation, the grounding gate logic circuit is used to connect the control gate of the write protect CAMS to the ground voltage level.

Another preferred embodiment of the present invention discloses a method of controlling the voltage applied to a plurality of write protect CAMS in a memory device. In this preferred embodiment, a programming voltage is generated with at least one voltage supply circuit. Then, the programming voltage is transferred to the write protect CAMS with a gate control circuit for a first predetermined amount of time. Then, a program verify voltage is generated with the voltage supply circuit and transferred to the write protect CAMS with the gate control circuit for a second predetermined amount of time. Once the programming mode is complete, the write protect CAMS are connected a ground voltage level with the gate control circuit. As such, no unwanted voltage is see by the write protect CAMS thereby ensuring data retention once programmed.

Another preferred embodiment of the present invention discloses a voltage supply system for programming a plurality of write protect CAMS in a memory device. In this embodiment, at least one voltage supply circuit is provided for generating a predetermined voltage. A gate control circuit is electrically connected with the output of the voltage supply circuit and the control gates of the plurality of write protect CAMS. The gate control circuit transfers the predetermined voltage to the control gates of the plurality of write protect CAMS only during programming mode and holds the control gates at a ground voltage level when not in programming mode.

These and other features and advantages of the invention will become apparent upon consideration of the following detailed description of the presently preferred embodiments of the invention, viewed in conjunction with the appended drawings.

DETAILED DESCRIPTION OF THE PRESENTLY PREFERRED EMBODIMENT OF THE PRESENT INVENTION

The exemplary embodiments of the invention are set forth below with reference to specific configurations, and those skilled in the art would recognize that various changes and modifications can be made on the specific configurations while remaining within the scope of the claims. The invention may be used with any type of memory device that includes write protect CAMS; however, the preferred embodiment of the invention is designed for a flash memory. Although the preferred embodiment of the invention uses supply voltage (Vcc) of 5.0 V, those skilled in the art would recognize that other supply voltage levels could be used.

Figure 1:
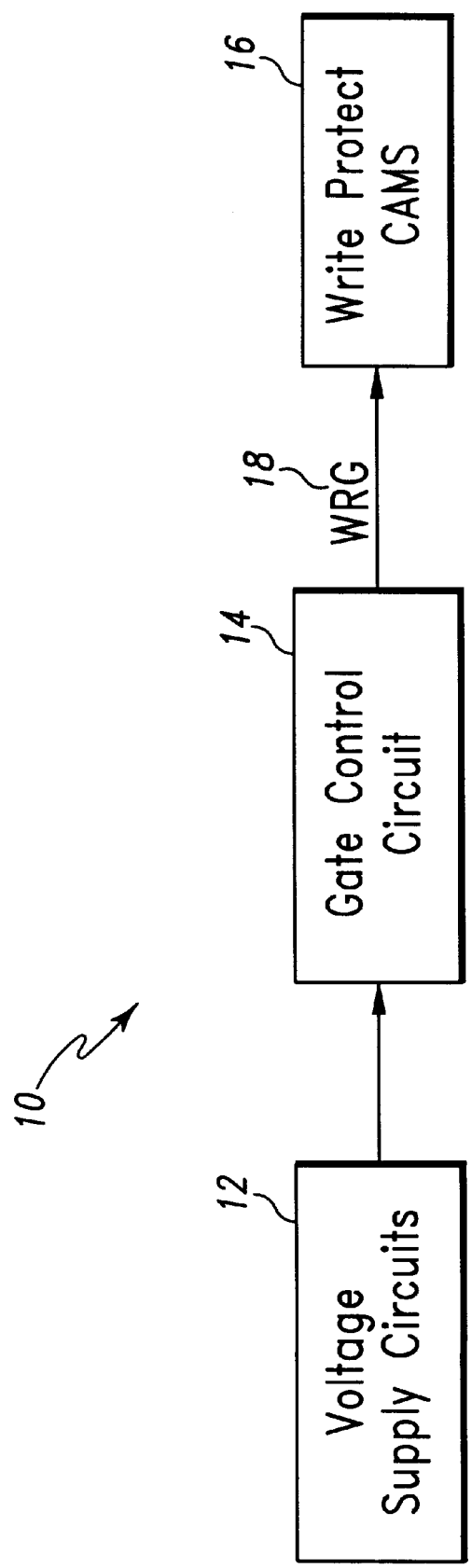
FIG. 1 illustrates a block diagram of a portion of the preferred flash memory incorporating the presently disclosed methods and systems of voltage protection of write protect CAMS.

Referring to FIG. 1, the present invention discloses a flash memory 10 that includes at least one voltage supply circuit 12, a gate control circuit 14 and a plurality of write protect CAMS 16 that are referred to hereinafter as WPCAMS 16. The voltage supply circuits 12 are electrically connected with the gate control circuit 14, which is in turn, electrically connected with the WPCAMS 16 by at least one gate line (WRG) 18.

After a sector of the flash memory 10 is programmed with information that needs to be protected from alteration, a user enters a write protect CAM programming mode to program a respective WPCAM 16. The WPCAM 16 is a programmable content addressable memory (CAM) location that when programmed disables the flash memory 10 from the ability to write to a corresponding sector of the flash memory 10. Although not illustrated, those skilled in the art would recognize that the preferred flash memory 10 is divided into a plurality of sectors where each sector contains an array of memory cells capable of storing information and that one sector is associated with a respective WPCAM 16.

In the preferred embodiment, the write protect CAM programming mode enables the gate control circuit 14 to transfer a predetermined program voltage and a predetermined program verify voltage that is generated by the voltage supply circuits 12 to the WPCAMS 16. The predetermined voltages are transferred to the gate lines (WRG) 18 that electrically connect the gate control circuit 14 with a control gate (not shown) of each respective WPCAM 16. When the user enables programming of the WPCAMS 16 during the write protect CAM programming mode, the voltage supply circuits 12 are activated to generate the predetermined programming voltage that is transferred to the WPCAMS 16 in the form of a programming pulse. To dissipate the predetermined programming pulse, the predetermined programming voltage level produced by the voltage supply circuits 12 is reduced to the supply voltage (Vcc) level, which is transferred to the WPCAMS 16.

Following dissipation of the programming pulse, the voltage supply circuits 12 are activated to generate a predetermined program verify voltage that is transferred to the WPCAMS 16 in the form of a program verify pulse. The program verify reads and verifies that the WPCAMS 16 are properly programmed. Those skilled in the art would recognize that the programming pulse and the program verify pulse are part of programming the WPCAMS 16 since the pulses are sequentially repeated until the WPCAMS 16 are properly programmed.

When the WPCAMS 16 are not being programmed, the gate control circuit 14 is activated to stop transferring voltage generated by the voltage supply circuits 12 to the gate lines (WRG) 18. The gate control circuit 14 electrically connects the gate lines (WRG) 18 to a ground voltage level (approximately 0 V) to protect the WPCAMS 16 from seeing any unwanted voltages after being programmed. As such, when voltages are not being applied to the WPCAMS 16, the control gates of the WPCAMS 16 are held at the ground voltage level so that there is no exposure to voltage and the information programmed into the WPCAMS 16 remains undisturbed.

The supply voltage (Vcc) is supplied by the voltage supply circuits 12 during the write protect CAM programming mode when the predetermined programming volta and the predetermined program verify voltage are not being generated. In the preferred embodiment, the supply voltage (Vcc) varies from approximately 4.5 to 5.5 V and is generated by an external power supply. The predetermined programming voltage in the preferred embodiment is generated from the supply voltage (Vcc) with a charge pump and varies from approximately 8.3 to 9.3 V. As known in the art, charge pumps receive a magnitude of input voltage that is channeled through a serif of capacitive stages to increase the magnitude of the voltage generated at the output the charge pump. The predetermined program verify voltage is the supply voltage (Vcc) reduced in magnitude and is about 2 V in the preferred embodiment. Those skilled in the art would recognize that there are many variations of the voltage supply circuits 12 that are capable of supplying the respective voltages. As such, a detailed description of the circuit configuration and operation of the voltage supply circuits 12 is not necessary for purpose of the present invention.

The WPCAMS 16 provide write protection for thirty-five non-uniform sized sectors (not shown) in the preferred flash memory 10. Each respective WPCAM 16 is selectively programmed or erased to indicate whether a predetermined sector is operating in a write protected state (read only) or an unprotected state (read/write). In the preferred embodiment of the present invention, if a respective WPCAM 16 is programmed it indicates that a respective sector, or a respective group of sectors, is write protected, and if the respective WPCAM 16 is erased it indicates that the respective sector, or respective group of sectors, is unprotected.

The WPCAMS 16 each include a control gate electrically connected with a respective gate line (WRG) 18. Those skilled in the art would recognize that the control gate within a particular WPCAM 16 is the control gate of a double poly program device (not shown). Similar to a flash transistor, predetermined voltages are applied to the gate lines 18 (WRG) during programming of the WPCAMS 16. For purposes of the present invention, those skilled in the art need only understand that the predetermined voltages present on the gate lines (WRG) 18 are applied to the respective control gates of the respective WPCAMS 16. Since content addressable memory (CAMS) devices are known in the art, a detailed discussion of the electrical configuration and operation of WPCAMS 16 is unnecessary.

Figure 2:
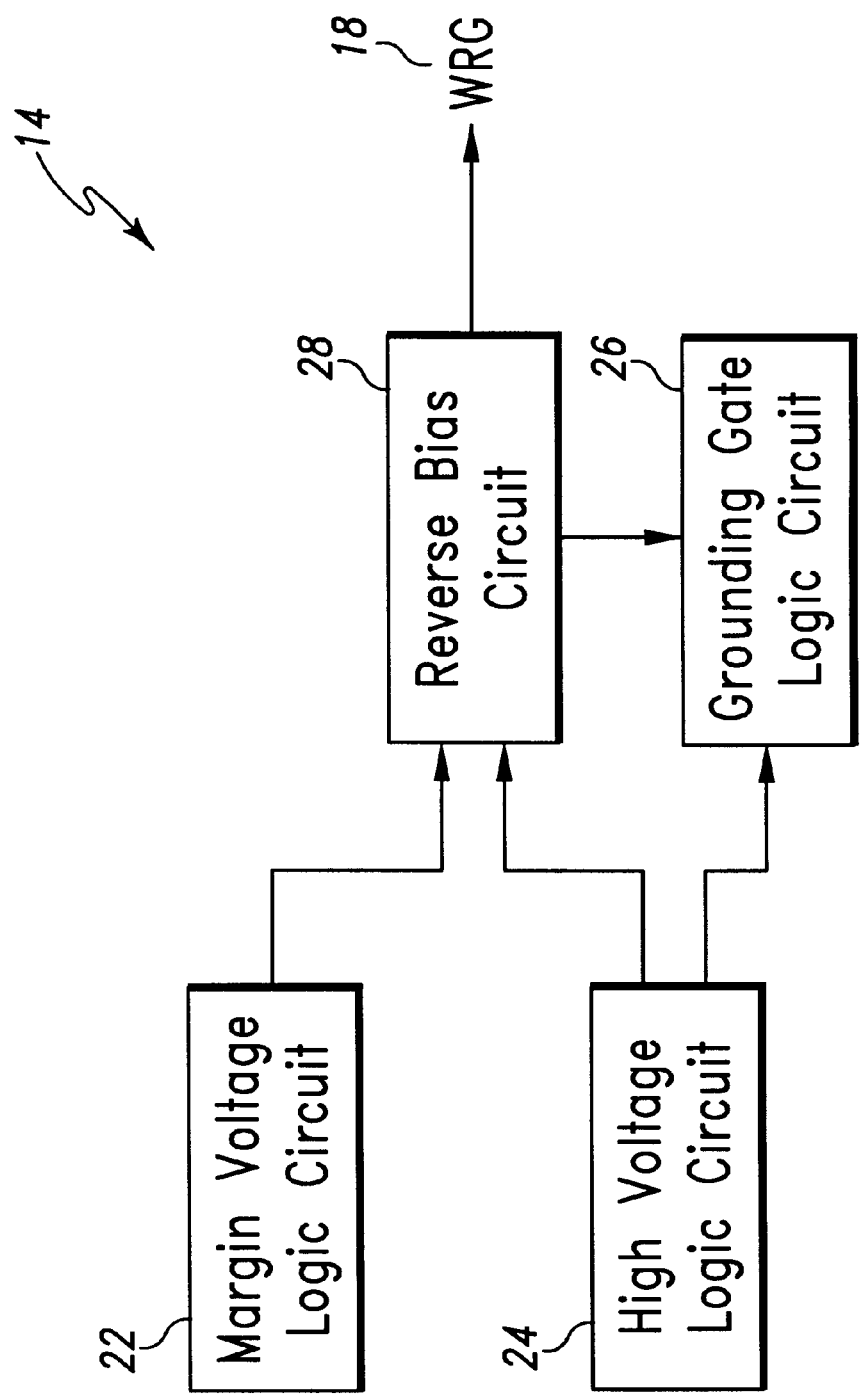
FIG. 2 illustrates a block diagram of a preferred gate control circuit of the present invention.

FIG. 2 illustrates a block diagram representing the preferred gate control circuit 14. The gate control circuit 14 includes a margin voltage logic circuit 22, a high voltage logic circuit 24, a grounding gate logic circuit 26 and a reverse bias circuit 28. The margin voltage logic circuit 22 and the high voltage logic circuit 24 are electrically connected with the reverse bias circuit 28 as illustrated in FIG. 2. The high voltage logic circuit 24 is electrically connected with the grounding gate logic circuit 26. The reverse bias circuit 28 is electrically connected with the grounding gate logic circuit 26. As set forth below, the voltage supply circuits 12 and the WPCAMS 16 aer electrically connected with the high voltage logic circuit 24 and the reverse bias circuit 28 respectively.

Figure 3:
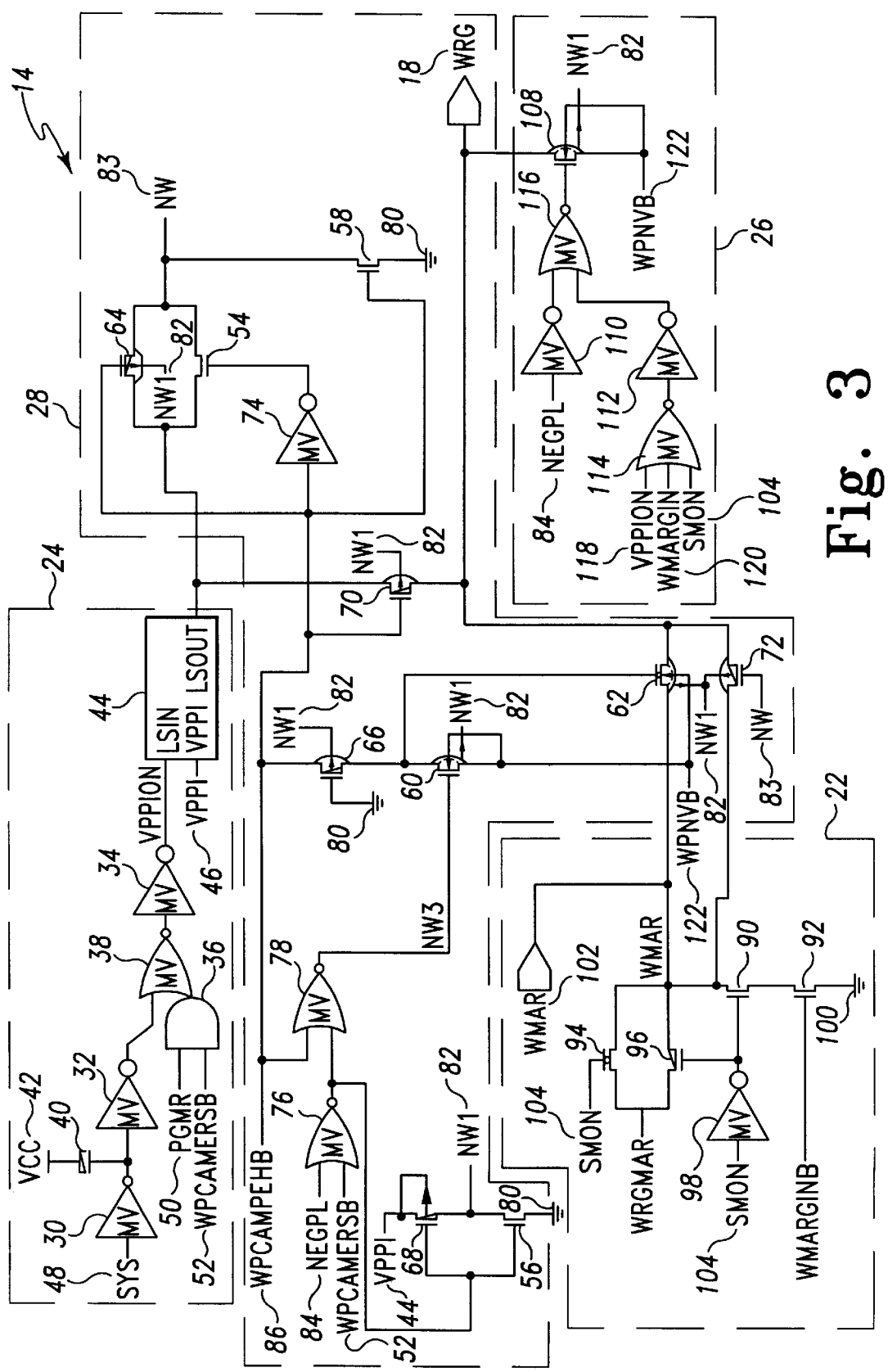
FIG. 3 illustrates a circuit schematic of the preferred gate control circuit of the present invention set forth in the block diagram of FIG. 2.

FIG. 3 illustrates a circuit schematic of the block diagram set forth in FIG. 2. The preferred high voltage logic circuit 24 includes a plurality of inverters 30-34, an AND gate 36, a NOR gate 38, a capacitor 40, a supply voltage connection (Vcc) 42 and a level shifter 44 that are electrically connected as illustrated in FIG. 3. The high voltage logic circuit 24 is supplied voltage from the voltage supply circuits 12 on the program voltage line (VPPI) 46. Predetermined electric signals are generated on a system program pulse line (SYS) 48, a program reset line (PGMR) 50 and a WPCAM erase line (WPCAMERSB) 52 to activate the level shifter 44 when the WPCAMS 16 are being programmed. The predetermined electric signals are generated by voltages applied to the flash memory 10 on a plurality of external pins (not shown) by a user during programming and erasing of the WPCAMS 16.

Programming and erasing of the WPCAMS 16 occurs during a user manual mode. During the user manual mode, the user selectively applies predetermined voltages to the plurality of external pins to generate corresponding predetermined electric signals. The predetermined electric signals are directed to a plurality of signal lines within the flash memory 10 that correspond to the plurality of external pins. Manual application of the predetermined electric signals activates the flash memory 10 to perform operations associated with the programming and erasing of the WPCAMS 16 at the direction of the user. Those skilled in the art would recognize that a detailed discussion regarding the plurality of external pins is beyond the scope of the present invention.

During operation, a conducting electric signal is generated by the user on the system program pulse line (SYS) 48 when the predetermined programming voltage is being transferred to the WPCAMS 16 and on the program reset line (PGMR) 50 to allow the predetermined programming voltage to dissipate. Dissipation of the predetermined programming voltage avoids high current during hot switching that can damage the transistors in the gate control circuit 14. The WPCAM erase line (WPCAMERSB) 52 provides a non-conducting signal when the WPCAMS 16 are being erased so that the level shifter 44 will not be activated. Those skilled in the are recognize that level shifters are well known circuits that when activated pass voltage from an input to an output. In the preferred high voltage logic circuit 24, when activated, the level shifter 44 passes voltage supplied on the program voltage line (VPPI) 46 to the reverse bias circuit 28. Those skilled in the art would also recognize; that erasing the WPCAMS 16 is beyond the scope of the present invention since era does not occur during the write protect CAM programming mode.

The preferred reverse bias circuit 28 includes a plurality of n-channel transistors 54-58, a triple-well n-channel transistor 60, a low-threshold triple-well n-channel transistor 62, a plurality of p-channel transistors 64-72, an inverter 74, a plurality of NOR gates 76-78 and a ground connection 80 that are electrically connected as illustrated in FIG. 3. The reverse bias circuit 28 maintains a reverse bias condition on transistors 60, 62, 64, 66, 70, 72 to avoid activation of diodes within the respective transistors. As known in the art, if the diodes are activated, leakage current will occur that can compromise the reliable operation of the transistors. In the preferred embodiment, those skilled in the art would recognize that the reverse bias is maintained by an appropriate voltage supplied on a first n-well line (NW1) 82 and a second n-well line (NW2) 83 that is varied as the WPCAMS 16 are programmed and erased.

The reverse bias circuit 28 is activated to supply the appropriate voltage on the first n-well line (NW1) 82 and the second n-well line (NW2) 83 by predetermined electric signals generated by the user on the WPCAM program line (WPCAMERSB) 52, a negative erase voltage line (NEGPL) 84 and a WPCAM program/erase line (WPCAMEHB) 86. The WPCAM program/erase line (WPCAMEHB) 86 is conducting during both program and erase of the WPCAMS 16 and the negative erase voltage line (NEGPL) 84 is conducting during erase only.

The preferred reverse bias circuit 28 is also activated to transfer voltage frorr the high voltage logic circuit 24 to the gate lines (WRG) 18 during the write protect CAM programming mode. Transistor 70 within the reverse bias circuit 28 acts as a pass gate to transfer voltage when a conducting electric signal is generated by the user on the WPCAM program/erase line (WPCAMEHB) 86. The reverse bias circuit 28 similarly transfers voltage supplied from the margin voltage logic circuit 22 to the gate lines (WRG) 18 with transistor 62.

Referring again to FIG. 3, the preferred margin voltage logic circuit 22 includes a plurality of n-channel transistors 90-92, a low-threshold n-channel transistor 94, a p-channel transistor 96, an inverter 98 and a ground connection 100 that are electrically connected as illustrated in FIG. 3. The preferred margin voltage logic circuit 22 operates during the program verify operation of the WPCAMS 16. As known in the art, the program verify confirms that the WPCAMS 16 have been properly programmed and occurs each time the WPCAMS 16 are programmed.

In the preferred embodiment, during the program verify within the WPCAM programming mode, the predetermined program verify voltage of about 2 V is supplied on a gate verify line (WMAR) 102 by the voltage supply circuits 12. The program verify voltage is transferred to the gate lines (WRG) 18 by transistor 62 of the reverse bias circuit 28. Transistor 62 is activated by a conducting electric signal on the WPCAM program/erase line (WPCAMEHB) 86. The remaining lines of the margin voltage logic circuit 22 pertain to operations that are beyond the scope of the present invention. For purposes of the preferred embodiment of the present invention, it is only necessary for those skilled in the art to understand that during the program verify of the WPCAMS 16, the voltage supply circuits 12 are activated to generate the predetermined program verify voltage that is transferred to the gate lines (WRG) 18.

The grounding gate logic circuit 26 of the preferred embodiment of the press invention includes a triple-well n-channel transistor 108, a plurality of inverters 110–112 and a plurality of NOR gates 114–116 that are electrically connected as illustrated in FIG. 3. Transistor 108 is also electrically connected with the reverse bias circuit by the first n-well line 82 (NW1) to maintain the reverse bias condition as previous discussed.

The preferred grounding gate logic circuit 26 is activated by predetermined electric signals generated by the user on the negative erase voltage line (NEGPL) 84, the state machine on line (SMON) 104, a high voltage on line (VPPION) 118 and a write protect gate margin line (WMARGIN) 120 to electrically connect the gate lines (WRG) 18 with a gate protection line (WPNVB) 122. The state machine on line (SMON) 104 begins conducting during embedded modes of operation where the flash memory 10 can perform operations in an automated fashion. For purposes of the present invention, those skilled in the art need only understand that the WPCAM programming mode occurs during the user manual mode and not during the embedded mode.

The high voltage on line (VPPION) 118 and the write protect gate margin line (WMARGIN) 120 begin conducting during the program and program verify mode of the WPCAMS 16. During the write protect CAM programming mode, the gate protection line (WPNVB) 122 is electrically connected with a ground connection (not shown). When activated, transistor 108 of the grounding gate logic circuit 26 electrically connects the gate lines (WRG) 18 with the gate protection line (WPNVB) 122, thereby pulling the magnitude of voltage on the gate lines (WRG) 18 down to a ground voltage level of approximately zero volts. During programming and verification of the WPCAMS 16, transistor 108 is deactivated.

In the preferred embodiment of the present invention, write protection of sectors in the flash memory 10 is accomplished during the write protect CAM programming mode as previously set forth. When the user enters the write protect CAM programming mode, transistor 70 of the reverse bias circuit 28 is enabled by a predetermined electric signal generated on the WPCAM program line (WPCAMERSB) 52. Since the WPCAMS 16 are not yet being programmed, the level shifter 44 of the high voltage logic circuit 22 is not activated to pass voltage to the reverse bias circuit 28 and therefore the control gates of the WPCAMS 16 are not exposed to voltage.

When programming of the WPCAMS is enabled, a conducting electric signal is generated on the system program pulse line (SYS) 48 and the voltage supply circuits 12 are activated by the user to generate the predetermined programming voltage. Since there is a non-conducting electric signal on the program reset line (PGMR) 50 and a conducting electric signal on the WPCAM erase line (WPCAMERSB) 52, the level shifter 44 is activated. Once activated, the level shifter 44 passes the predetermined programming voltage on the program voltage line (VPPI) 46 to a reverse bias circuit 28. Since transistor 70 of the reverse bias circuit 28 is activated, the predetermined programming voltage is transferred to the gate lines (WRG) 18 as a programming pulse that occurs during a first predetermined amount time. Those skilled in the art would recognize that the WPCAM erase line (WPCAMERSB) 52 disallows activation of the level shifter 44 during erase of the WPCAMS 16.

To end the programming pulse supplied to the WPCAMS 16, a non-conducting electric signal is generated on the system program pulse line (SYS) 48 and the volt supply circuits 12 are activated by the user to supply the supply voltage (Vcc) level to the gate lines (WRG) 18. In addition, the program reset line (PGMR) 50 begins conducting such that the level shifter 44 remains activated to transfer the supply voltage (Vcc) level to the gate lines (WRG) 18. Once the predetermined programming voltage on the gate lines (WRG) 18 has dissipated to the supply voltage (Vcc) level, the program reset line (PGMR) 50 stops conducting thereby deactivating the level shifter 44 in the high voltage logic circuit 22. As a result, the high voltage on line (VPPION) 118 becomes non-conducting thereby activating transistor 108 of the grounding gate logic circuit 26 to electrically connect the gate lines (WRG) 18 to the gate protection line (WPNVB) 122. Those skilled in the art would recognize that since the control gates of the WPCAMS 16 are at approximately zero volts while the gate lines (WRG) 18 are electrically connected with the gate protection line (WPNVB) 122, disturbance of the programming of the WPCAMS 16 is unlikely.

When the program verify operation occurs following dissipation of the predetermined programming voltage, the voltage supply circuits 12 are activated by the user to generate the predetermined program verify voltage. Transistor 62 that was previously activated by the conducting electric signal generated on the WPCAM erase line (WPCAMERSB) 52 passes the predetermined program verify voltage provided on the gate verify line (WMAR) 102 to the gate lines (WRG) 18 as a program verify pulse that occurs within a second predetermined amount of time. In addition, a conducting electric signal is generated on the write protect gate margin line (WMARGIN) 120 thereby deactivating transistor 108 such that the gate lines (WRG) 18 are not electrically connected with the gate protection line (WPNVB) 122. At the conclusion of the program verify, the electric signal on the write protect gate margin line (WMARGIN) 120 stops conducting, the voltage supply circuits 12 stop generating the predetermined program verify voltage and the gate lines (WRG) 18 are again electrically connected with the gate protection line (WPNVB) 122.

During write protect CAM programming mode, voltage is only allowed to the control gate of the WPCAMS 16 during program and program verify of the WPCAMS 16. At all other times, the gate lines (WRG) 18, which are electrically connected with the control gates of the WPCAMS 16, are electrically connected with the gate protection line (WPNVB) 122. Since the control gates are maintained at approximately zero volts while the gate lines (WRG) 18 are connected with the gate protection line (WPNVB) 122, the WPCAMS 16 will not be disturbed and experience charge loss. By not allowing the WPCAMS 16 to be stressed by exposure to voltage such as the supply voltage (Vcc) for extended periods of time, reliability of data programmed into the WPCAMS 16 is maintained.

The WPCAMS 16 are programmed during the user manual mode in the preferred embodiment. Typically, during the user manual mode the program operation is immediately followed by the program verify operation such that electrical connection with the gate protection line (WPNVB)

122 does not occur between the program and program verify operations. However, the program verify operation is initiated manually and may not immediately follow the program operation. In this instance, electrical connection with the gate protection line (WPNVB) 122 may occur between the program and program verify operations.

While the invention has been described in its currently best known modes of operation and embodiments, other modes and embodiments of the invention will be apparent to those skilled in the art. It is the following claims, including all equivalents that are intended to define the spirit and scope of the invention.

What is claimed is:

1. A method of controlling the voltage applied to a plurality of write protect CAMS in a memory device, comprising the steps of:
    generating a predetermined voltage with at least one voltage supply circuit;
    transferring said predetermined voltage with a gate control circuit to at least one control gate of a write protect CAM; and
    connecting said control gate of said write protect CAM to a ground voltage level with said gate control circuit when said predetermined voltage is not being transferred to said control gate of said write protect CAM.

2. The method of claim 1, wherein said predetermined voltage is a programming voltage.

3. The method of claim 2, wherein said programming voltage is about 8.5 V.

4. The method of claim 1, wherein said predetermined voltage is a program verify voltage.

5. The method of claim 4, wherein said program verify voltage is about 2 V.

6. The method of claim 1, wherein said gate control circuit comprises a margin voltage logic circuit, a high voltage logic circuit, a grounding gate logic circuit and a reverse bias circuit.

7. The method of claim 6, wherein said grounding gate logic circuit is used to connect said control gate of said write protect CAM to said ground voltage level.

8. A method of controlling the voltage applied to a plurality of write protect CAMS in a memory device, comprising the steps of:
    generating a programming voltage with at least one voltage supply circuit;
    transferring said programming voltage to said plurality of write protect CAMS with a gate control circuit for a first predetermined amount of time;
    generating a program verify voltage with said voltage supply circuit;
    transferring said program verify voltage to said write protect CAMS with said gate control circuit for a second predetermined amount of time; and
    connecting said write protect CAMS to a ground voltage level with said gate control circuit.

9. The method of claim 8, wherein said predetermined voltage is transferred to said plurality of write protect CAMS on at least one gate line.

10. The method of claim 8, wherein said predetermined voltage is supplied to a control gate of each of said plurality of write protect CAMS.

11. The method of claim 8, wherein said programming voltage is about 8.5 V.

12. The method of claim 8, wherein said program verify voltage is about 2 V.

13. The method of claim 8, wherein said plurality of write protect CAMS are programmed during a write protect CAM programming mode.

14. The method of claim 8, wherein said gate control circuit comprises a margin voltage logic circuit, a high voltage logic circuit, a grounding gate logic circuit and a reverse bias circuit.

15. The method of claim 14, wherein said grounding gate logic circuit is used to connect said write protect CAMS to said ground voltage level.

16. A voltage supply system for programming a plurality of write protect CAMS in a memory device, comprising:
    at least one voltage supply circuit for generating a predetermined voltage;
    a gate control circuit electrically connected with the output of said voltage supply circuit and the control gates of said write protect CAMS, wherein said gate control circuit is operable to transfer said predetermined voltage to the control gates of said write protect CAMS only during programming and holds the control gates of said write protect CAMS at a ground voltage level when not programming said write protect CAMS.

17. The voltage supply system of claim 16, wherein said predetermined voltage is a programming voltage.

18. The voltage supply system of claim 17, wherein said programming voltage is about 8.5 V.

19. The voltage supply system of claim 16, wherein said predetermined voltage is a program verify voltage.

20. The voltage supply system of claim 19, wherein said program verify voltage is about 2 V.

21. The voltage supply system of claim 16, wherein said gate control circuit comprises a margin voltage logic circuit, a high voltage logic circuit, a grounding gate logic circuit and a reserve bias circuit.

22. The voltage supply system of claim 21, wherein said grounding gate logic circuit is used to hold said control gate of said write protect CAMS at said ground voltage level.

* * * * *